US012683119B2

(12) United States Patent
Muraki et al.

(10) Patent No.: US 12,683,119 B2
(45) Date of Patent: Jul. 14, 2026

(54) COMPUTER, PROGRAM, AND CHARGED PARTICLE BEAM PROCESSING SYSTEM

(71) Applicant: HITACHI HIGH-TECH ANALYSIS CORPORATION, Tokyo (JP)

(72) Inventors: Ayana Muraki, Tokyo (JP); Tatsuya Asahata, Tokyo (JP); Satoshi Tomimatsu, Tokyo (JP); Makoto Sato, Tokyo (JP)

(73) Assignee: Hitachi High-Tech Science Corporation, Tokyo (JP)

( * ) Notice: Subject to any disclaimer, the term of this patent is extended or adjusted under 35 U.S.C. 154(b) by 355 days.

(21) Appl. No.: 18/687,252

(22) PCT Filed: Sep. 1, 2021

(86) PCT No.: PCT/JP2021/032135
§ 371 (c)(1),
(2) Date: Feb. 27, 2024

(87) PCT Pub. No.: WO2023/032079
PCT Pub. Date: Mar. 9, 2023

(65) Prior Publication Data
US 2025/0014859 A1    Jan. 9, 2025

(51) Int. Cl.
*H01J 37/30* (2006.01)
*H01J 37/28* (2006.01)
*H01J 37/302* (2006.01)

(52) U.S. Cl.
CPC ........... *H01J 37/3023* (2013.01); *H01J 37/28* (2013.01)

(58) Field of Classification Search
CPC .............................. H01J 37/3023; H01J 37/28
See application file for complete search history.

(56) References Cited

U.S. PATENT DOCUMENTS

| | | | |
|---|---|---|---|
| 2017/0194126 A1* | 7/2017 | Bhaskar | G01N 23/2251 |
| 2019/0204750 A1* | 7/2019 | Wang | G03F 9/7046 |
| 2021/0027455 A1* | 1/2021 | Kimizuka | H01J 37/28 |

FOREIGN PATENT DOCUMENTS

| | | |
|---|---|---|
| JP | 2007-003212 | 1/2007 |
| JP | 2008-147143 | 6/2008 |
| JP | 2015-185327 | 10/2015 |
| WO | 02/075806 | 9/2002 |
| WO | 2016/002719 | 1/2016 |

* cited by examiner

*Primary Examiner* — Nicole M Ippolito
(74) *Attorney, Agent, or Firm* — Holland & Hart LLP

(57) ABSTRACT

The present invention provides a computer, a program, and a charged particle beam processing system, with which it is possible to reduce adjustment and setting work of conditions for observation or machining by an operator in an FIB-SEM composite device. This computer comprises: an information acquisition unit that acquires information related to a recipe to be executed by a charged particle beam device provided with a charged particle irradiation optical system; and an information management unit that generates recipe management information based on the information acquired by the information acquisition unit and stores the recipe management information in a storage unit.

12 Claims, 7 Drawing Sheets

COMPUTER, PROGRAM, AND CHARGED PARTICLE BEAM PROCESSING SYSTEM

CROSS REFERENCE

The present Application for Patent is a 371 national phase filing of International Patent Application No. PCT/JP2021/032135, by MURAKI et al., entitled "COMPUTER, PROGRAM, AND CHARGED PARTICLE BEAM PROCESSING SYSTEM," filed Sep. 1, 2021, assigned to the assignee hereof, and expressly incorporated by reference herein.

TECHNICAL FIELD

The present disclosure relates to a computer, a program, and a charged particle beam processing system.

BACKGROUND ART

An FIB-SEM composite-type charged particle beam apparatus that can emit a charged particle beam (hereafter, also referred to as an FIB-SEM composite apparatus) is known (e.g., see Patent Document 1). In an FIB-SEM composite apparatus, for example, it is possible to emit one of two kinds of charged particle beams called a Focused Ion Beam (FIB) and an Electron beam (EB) separate or emit both of the beams.

In an FIB-SEM composite apparatus, for example, cross-section processing that uses a focused ion beam (FIB), obtaining a cross-section image of a sample by scanning the sample with an electron beam (EB) through a Scanning Electron Microscope (SEM), etc. are performed.

In an FIB-SEM apparatus, it is performed to extract a sample piece manufactured by emitting a charged particle beam composed of electrons or ions to a sample and to process the sample piece into shapes suitable for various processes such as observing, analyzing, and measuring through a Transmission Electron Microscope (TEM). In such an FIB-SEM composite apparatus, when observation is performed by a TEM, so-called Micro-sampling (MS) that manufactures a TEM sample by taking out a thin sample piece from a sample that is an observation target object and then holding the thin sample piece on a holder (sample piece holder) is performed.

RELATED ART DOCUMENT

Patent Document

International Patent Application Publication No. 2016/002719

DISCLOSURE

Technical Problem

However, when manufacturing a sample such as a lamella for TEM observation through an FIB-SEM composite apparatus, an operator needs to adjust and set necessary conditions so that appropriate observation conditions and processing conditions are used in each of processes for manufacturing.

For example, even though the same observation and processing are performed in a plurality of FIB-SEM composite apparatuses, an operator needs to perform work of adjusting and setting in each of the apparatuses due to the problem that there is no structure for sharing settings such as observation conditions and processing conditions between the apparatuses and the problem that there are apparatus differences (machine differences), so operators have felt a burden.

Further, the precision of such adjusting and setting or time for work depends on the proficiency of operators and this difference influences the quality of samples and the yield ratio in manufacturing of samples The present disclosure has been made in consideration of this matter and an objective of the present disclosure is to provide a computer, a program, and a charged particle beam processing system that can reduce work of adjusting and setting a condition for observation or processing by an operator.

Further, another objective of the present disclosure is to provide a computer, a program, and a charged particle beam processing system that enables a coordination of a plurality of FIB-SEM composite apparatuses.

Technical Solution

As a configuration example, it is a charged particle beam processing system comprising a computer; and a charged particle beam apparatus that comprises a charged particle irradiation optics, wherein the charged particle beam processing system comprises two or more charged particle beam apparatuses including a first charged particle beam apparatus of a first model and a second charged particle beam apparatus of a second model that is different from the first model, wherein the computer comprise an information obtainer configured to obtain information about a recipe that is executed in the charged particle beam apparatus an information manager configured to generate recipe management information based on the information obtained by the information obtainer and store the recipe management information in a storage; an information selector configured to select information based on the recipe management information; and a recipe assigner configured to assign a recipe to predetermined targets based on the information selected by the information selector, and wherein the charged particle beam apparatus comprises a recipe executor configured to execute processing of a recipe assigned by the computer, wherein the charged particle beam processing system performs workflow through coordination of the two or more charged particle beam apparatuses and, in the workflow, after the first charged particle beam apparatus executes processing of a first recipe to a sample, the second charged particle beam apparatus executes processing of a second recipe to the sample to which the processing of the first recipe has been executed; wherein the first charged particle beam apparatus, after executing processing of the first recipe, notifies the computer of first information about the processing; wherein the computer determines second information that is to be notified to the second charged particle beam apparatus based on the first information notified from the first charged beam apparatus and notifies the second charged beam apparatus of the second information that is determined; wherein the first information includes predetermined information about the sample mounted on a pillar in processing of the first recipe of the first charged particle beam apparatus; wherein the second information is information enabling determination of a position for executing processing of the second recipe that is subsequent to processing of the first recipe; and wherein the second charged particle beam apparatus determines the position based on the second information notified from the computer and executes processing or process of observation as processing of the second recipe.

As a configuration example, it is a charged particle beam processing system comprising a computer and a charged particle beam apparatus that comprises a charged particle irradiation optics, wherein the charged particle beam processing system comprises two or more charged particle beam apparatuses including a first charged particle beam apparatus of a first model and a second charged particle beam apparatus of a second model that is different from the first model, wherein the computer includes an information obtainer configured to obtain information about a recipe that is executed in the charged particle beam apparatus; an information manager configured to generate recipe management information based on information obtained by the information obtainer and store the recipe management information in a storage; an information selector configured to select information based on the recipe management information; and a recipe assigner configured to assign a recipe to predetermined targets based on the information selected by the information selector, wherein the charged particle beam apparatus comprises a recipe executor configured to execute processing of a recipe assigned by the computer, wherein the charged particle beam processing system performs workflow through coordination of the two or more charged particle beam apparatuses and, in the workflow, after the first charged particle beam apparatus executes processing of a first recipe to a sample, the second charged particle beam apparatus executes processing of a second recipe to the sample to which the processing of the first recipe has been executed; wherein the first charged particle beam apparatus, after executing processing of the first recipe, notifies the computer of first information about the processing; wherein the computer determines second information that is to be notified to the second charged particle beam apparatus based on the first information notified from the first charged beam apparatus and notifies the second charged beam apparatus of the second information that is determined; and wherein in case the first information notified from the first charged particle beam apparatus cannot be applied to the second charged particle beam apparatus, as is, the computer, after converting the first information to different information that can be applied to the second charged particle beam apparatus, notifies the second charged particle beam apparatus of information after conversion.

As a configuration example, it is a program for making a computer execute a first process that obtains information about a recipe that is executed in a charged particle beam apparatus including charged particle irradiation optics, and second processing of creating recipe management information based on the information obtained by the information obtainer and storing the recipe management information in a storage.

As a configuration example, it is a charged particle beam processing system including a charged particle beam apparatus, which comprises a charged particle irradiation optics, and a computer, in which the computer comprises: an information obtainer that obtains information about a recipe that is executed in the charged particle beam apparatus; an information manager that generates recipe management information based on the information obtained by the information obtainer and stores the recipe management information in a storage; an information selector that selects information based on the recipe management information; and a recipe assigner that assigns a recipe to predetermined targets based on the information selected by the information selector, and the charged particle beam apparatus includes a recipe executor configured to execute processing of a recipe assigned by the computer.

Effects of Invention

According to the computer, the program, and the charged particle beam processing system according to the present disclosure, it is possible to reduce work of adjusting and setting a condition for observation or processing by an operator in an FIB-SEM composite apparatus.

Further, according to the computer, the program, and the charged particle beam processing system according to the present disclosure, it is possible to coordinate a plurality of FIB-SEM composite apparatuses.

EMBODIMENTS OF INVENTION

Hereinafter, embodiments of the present disclosure are described with reference to the accompanying drawings.

First Embodiment

Charged Particle Beam Processing System

Figure 1:
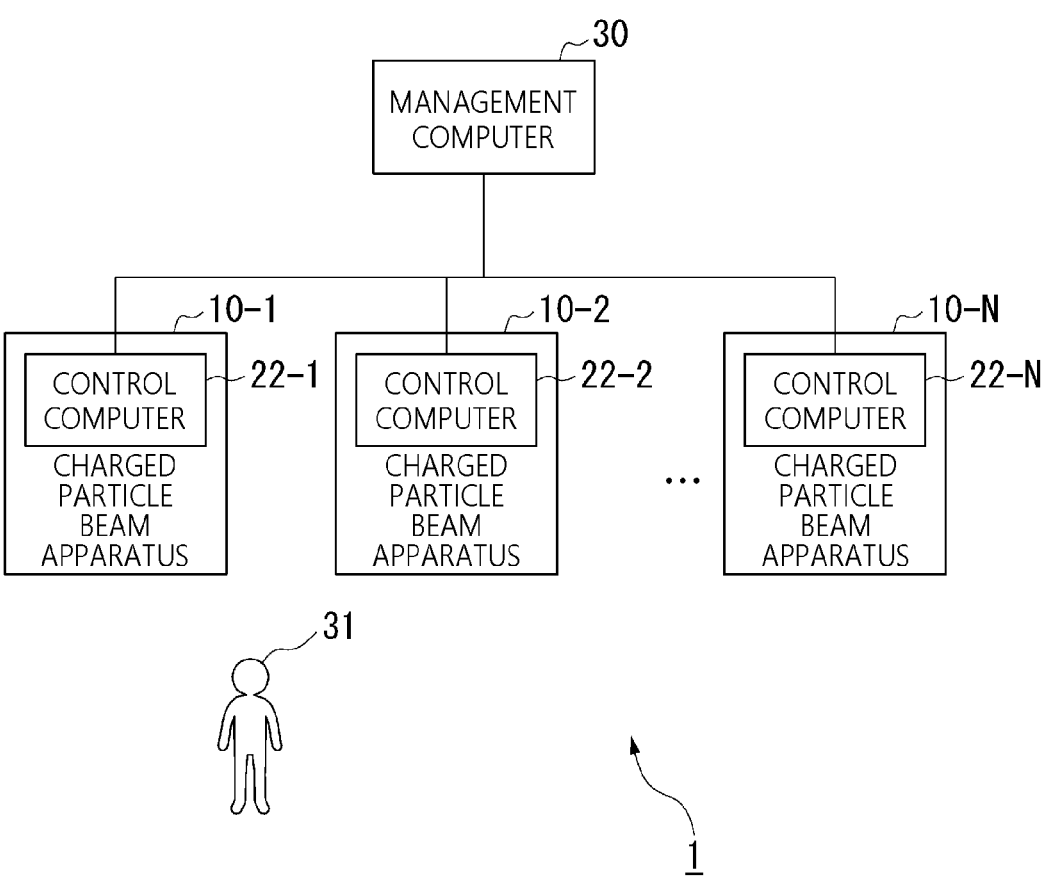
FIG. 1 is a view showing a schematic configuration of a charged particle beam processing system according to an embodiment (first embodiment) of the present disclosure.

FIG. 1 is a view showing a schematic configuration of a charged particle beam processing system 1 according to an embodiment (first embodiment) of the present disclosure.

The charged particle beam processing system 1 is briefly described.

The charged particle beam processing system 1 includes N (N is an integer of 1 or more) charged particle beam apparatuses 10-1~10-N and one management computer 30.

The charged particle beam apparatuses 10-1~10-N include control computers 22-1~22-N, respectively.

The management computer 30 and the control computers 22-1~22-N of the charged particle beam apparatuses 10-1~10-N are connected such that communication is possible. The management computer 30 includes a communication interface for communicating with the control computers 22-1~22-N of the charged particle beam apparatuses 10-1~10-N. The control computers 22-1~22-N of the charged particle beam apparatuses 10-1~10-N each include a communication interface for communicating with the management computer 30.

In this embodiment, communication is performed through wired lines, and as another configuration example, it may be performed through wireless lines.

In this embodiment, the charged particle beam apparatuses 10-1~10-N and the management computer 30 are operated by an operator 31.

In this case, in the example of FIG. 1, it is shown that the charged particle beam processing system 1 includes three or more charged particle beam apparatuses 10-1~10-N, but the number of the charged particle beam apparatuses 10-1~10-N included in the charged particle beam processing system 1 may be one or two.

As described above, in this embodiment, for one or a plurality of charged particle beam apparatuses 10-1~10-N, the management computer 30 network-connected with the charged particle beam apparatuses 10-1~10-N is an upper computer. Further, in this embodiment, the case in which the management computer 30 is composed of one computer is shown, but, as another configuration example, the management computer 30 may be configured by combining a plurality of computers.

Further, in the example of FIG. 1, for the convenience of description, the case in which the operator 31 operates the control computers 22-1~22-N of all of the charged particle beam apparatuses 10-1~10-N is shown, but the control computers 22-1~22-N may be operated by the same operator 31 or may be operated by different operators.

Further, in the example of FIG. 1, for the convenience of description, the case in which the operator 31 controls the control computers 22-1~22-N of the charged particle beam apparatuses 10-1~10-N and the management computer 30 is shown, but, for example, another exclusive person (another operator) who controls the management computer 30 may be provided.

[Charged Particle Beam Apparatus]

In this embodiment, the charged particle beam apparatuses 10-1~10-N are each an FIB-SEM composite apparatus and the case in which the apparatuses have the same configuration is described.

Accordingly, the charged particle beam apparatus 10-1 is described as a representative for the charged particle beam apparatuses 10-1~10-N.

Figure 2:
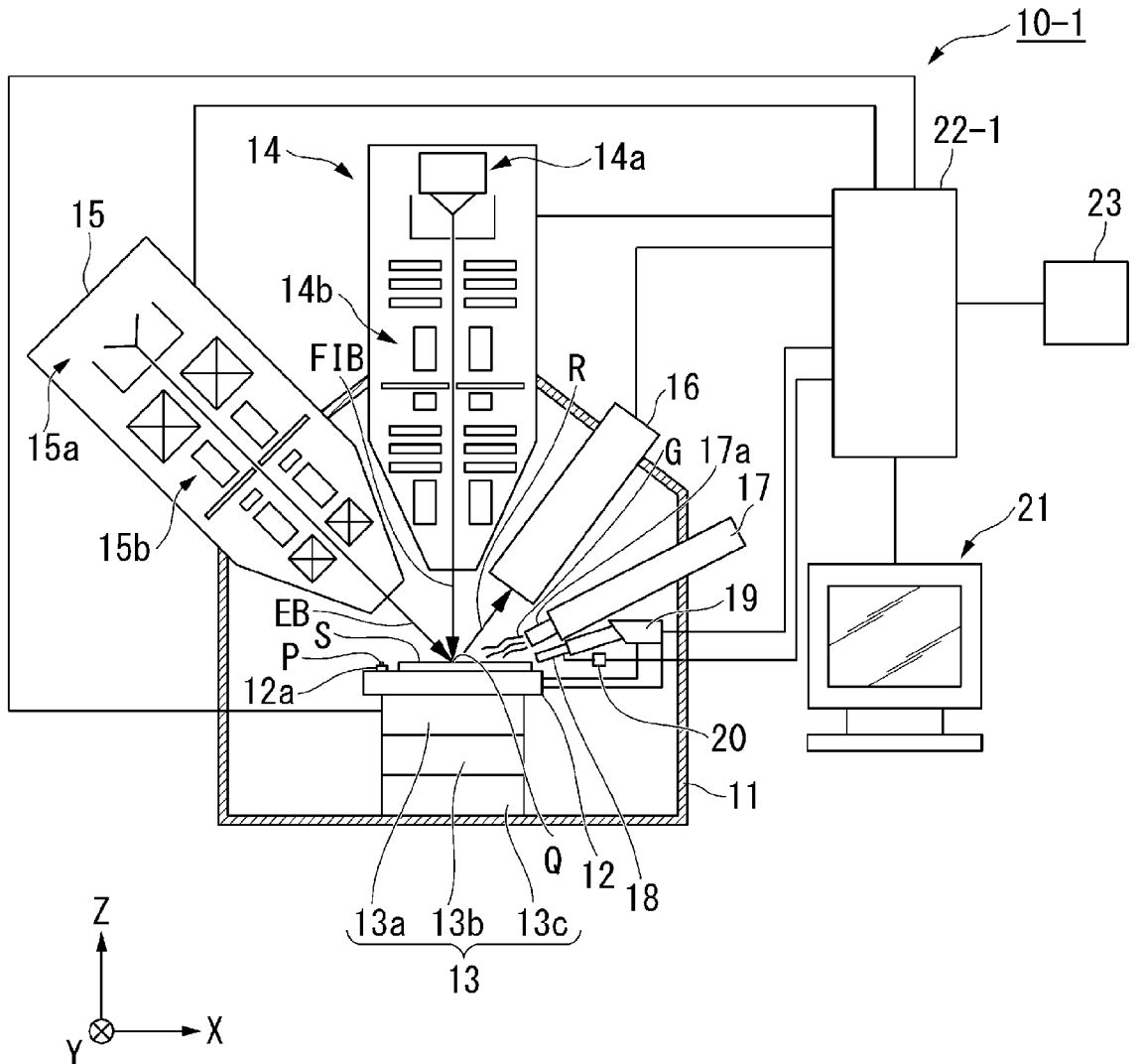
FIG. 2 is a view showing a schematic configuration of a charged particle beam apparatus according to an embodiment (the first embodiment) of the present disclosure.

FIG. 2 is a view showing a schematic configuration of the charged particle beam apparatus 10-1 according to an embodiment (the first embodiment) of the present disclosure. In FIG. 2, for the convenience of description, XYZ axes that are 3-dimensional orthogonal coordinate axes are shown. The charged particle beam apparatus 10-1 is briefly described.

The charged particle beam apparatus 10-1 includes a sample chamber 11, a sample stage 12, a stage drive mechanism 13, a focused ion beam irradiation optics 14, an electron beam irradiation optics 15, a gas supplier 17, a needle 18, a needle drive mechanism 19, an absorbed current detector 20, a display device 21, a control computer 22-1, and an input device 23.

The inside of the sample chamber 11 is maintained in a vacuum state.

The sample stage 12 fixes a sample S and a sample piece holder P in the sample chamber 11.

In this configuration, the sample stage 12 includes a holder fixing bed 12a that holds the sample piece holder P. The holder fixing bed 12a may have a structure on which a plurality of sample piece holders P can be mounted.

The stage drive mechanism 13 drives the sample stage 12.

In this configuration, the stage drive mechanism 13 is accommodated in the sample chamber 11 in a state connected to the sample stage 12 and moves the sample stage 12 with respect to a predetermined axis in accordance with a control signal that is output from the control computer 22-1. The stage drive mechanism 13 includes a mover 13a that moves the sample stage 12 parallel along at least the X axis and the Y axis, which are parallel to the horizontal plane and orthogonal to each other, and the vertical Z axis orthogonal to the X axis and the Y axis. The stage drive mechanism 13 includes an incliner 13b that inclines the sample stage 12 around the X axis or the Y axis and a rotator 13c that rotates the sample stage 12 around the Z axis.

The focused ion beam irradiation optics 14 emits a focused ion beam (FIB) to radiation targets in a predetermined radiation region (that is, a scan range) in the sample chamber 11. In this configuration, the focused ion beam irradiation optics 14 emits a focused ion beam downward from above in the vertical direction to radiation targets such as the sample S mounted on the sample stage 12, a sample piece Q, and the needle 18 existing in the radiation region.

The focused ion beam irradiation optics 14 includes an ion source 14a that produces ions and an ion optics 14b that focuses and biases ions coming out from the ion source 14a. The ion source 14a and the ion optics 14b are controlled in accordance with a control signal that is output from the control computer 22-1, and the radiation position, the radiation condition, etc. of a focused ion beam are controlled by the control computer 22-1.

The electron beam irradiation optics 15 emits an electron beam (EB) to radiation targets in the radiation region in the sample chamber 11. In this configuration, the electron beam irradiation optics 15 can emit an electron beam downward from above in an inclined direction inclined at a predetermined angle (e.g., 60°) with respect to the vertical direction to radiation targets such as a sample S fixed on the sample stage, a sample piece Q, and the needle 18 existing in the radiation region.

The electron beam irradiation optics 15 includes an electron source 15a that produces electrons and an electron optics 15b that focuses and biases electrons emitted from the electron source 15a. The electron source 15a and the electron optics 15b are controlled in accordance with a control signal that is output from the control computer 22-1, and the radiation position, the radiation condition, etc. of an electron beam are controlled by the control computer 22-1.

Further, it is possible to dispose the electron beam irradiation optics 15 in the vertical direction and the focused ion beam irradiation optics 14 in an inclined direction inclined at a predetermined angle from the vertical direction by switching the arrangement of the electron beam irradiation optics 15 and the focused ion beam irradiation optics 14.

The detector 16 detects secondary charged particles (secondary electrons, secondary ions) R that are produced from radiation targets by irradiation of a focused ion beam or an electron beam The gas supplier 17 supplies a gas G to the surface of radiation targets. The gas supplier 17 has a nozzle 17a at the front end.

The needle 18 takes out a fine sample piece Q from a sample S fixed on the sample stage 12 and holds and transfers the sample piece Q to the sample piece holder P.

The needle drive mechanism 19 conveys the sample piece Q by driving the needle 18.

The absorbed current detector 20 detects an inflow current (also called an absorbed current) of a charged particle beam traveling into the needle 18 and outputs the detected result to the control computer 22-1 as an inflow current signal.

The control computer 22-1 controls at least the stage drive mechanism 13, the focused ion beam irradiation optics 14, the electron beam irradiation optics 15, the gas supplier 17, and the needle drive mechanism 19.

The control computer 22-1 is disposed outside the sample chamber 11 and is connected with the display device 21 and the input device 23 such as a mouse and a keyboard that output a signal corresponding to input operation by an operator (the operator 31 in this embodiment).

The control computer 22-1 integrally controls operation of the charged particle beam apparatus 10-1 in response to a signal that is output from the input device 23 or a signal that is generated by preset automatic operation control processing.

In the charged particle beam apparatus 10-1, it is possible to execute various types of processing (e.g., excavating, trimming process, etc.) by imaging and sputtering of a radiation target, forming of a deposition film, etc., by irradiating and scanning the surface of the radiation target with the focused ion beam.

Detailed Example of Recipe

In each of the charged particle beam apparatuses 10-1~10-N, observing, processing, etc. of a sample are performed based on a recipe that prescribes various conditions such as an observation condition, a processing condition, etc.

A detailed example of a recipe is described.

There is an integrated recipe as an upper recipe. There is a lower-order recipe with respect to the integrated recipe. The integrated recipe is a combination of a plurality of lower-order recipes.

As the lower-order recipe, for example, a recipe for automatic MS, a processing recipe, a recipe for alignment, a recipe for eucentric adjustment, and a user input item.

The recipe for automatic MS is a recipe related to extraction of a micro sample in automatic micro sampling (automatic MS).

The processing recipe is a recipe related to a processing condition for manufacturing a micro sample. As the content of the processing recipe, for example, there are a processing flow, a beam condition, a matching condition, etc.

The recipe for alignment is a recipe related to alignment for correcting inclination or bending of a wafer when a chip or a wafer is mounted on a fixing part such as a holder (in the example of FIG. 2, the sample piece holder P). As the content of the recipe for alignment, for example, there are a matching position, a matching condition, etc. The recipe for alignment is used to accurately specify a processing position.

The recipe for eucentric adjustment is a recipe related to eucentric adjustment. As the content of the recipe for eucentric adjustment, for example, there are a setting about whether to manufacture a target through processing or whether to use an existing pattern, a matching condition of a target, etc.

In this case, the purpose of performing eucentric adjustment is to correct an observation object going out of a field of view due to inclination of a stage when the height of the stage is not fit. Further, an appropriate height of a stage depends on the thickness of a chip or a wafer and the method of attaching a carbon tape or a silver paste in pasting, so, basically, eucentric adjustment is required every time an observation object is changed. However, as a user input item by the operator 31, the thickness of a chip or a wafer is appropriately set, and when an error in pasting is also sufficiently small, it may be possible to set not executing eucentric adjustment in order to reduce processing time.

The summary of the order of eucentric adjustment is to determine an appropriate target, incline a stage, obtain a deviation amount by obtaining the position of the target through matching, repeatedly change the inclination amount of the stage and obtain the deviation amount a plurality of times, and finally, calculate an appropriate height of the stage from the deviation amount due to inclination of the stage.

The user input item is an item that is input by operation by a user (in this embodiment, the operator 31) in relation to the management computer 30, separately from information of a recipe that is output (exported) from each of the charged particle beam apparatus 10-1~10-N.

As the content of the user input item, for example, there are information about a chip or a wafer (e.g., a thickness, a material, etc.), a processing position (e.g., information designated in a coordinate system having a specific position as an origin in a chip or a wafer rather than stage coordinates), a mounted position of a micro sample (e.g., the position of a holder for mounting a TEM mesh, the position of a mesh, the position of pillar, etc.), defect information (e.g., a kind, a size, a position, etc.), or other information. As the other information described above, for example, there is information showing that eucentric adjustment is executed or information of settings related to recovery processing, etc. when processing fails.

In this embodiment, for the convenience of description, the information about a recipe is referred to as recipe information in the following description. The recipe information may include information that specifies all of the recipes included in an integrated recipe or may include information that specifies one or more of individual recipes lower than an integrated recipe, and may include information of some elements included in an integrated recipe or a lower-order recipe, and may include conditions when a recipe is used (e.g., defect information, chip information, wafer information, or the like).

Further, in this embodiment, after a recipe specified by the recipe information is executed, the recipe information includes information of the result of executing the recipe. That is, the result of executing a recipe specified by the recipe information is fed back to the recipe information. As described above, in this embodiment, before a recipe specified by the recipe information starts to be executed, the recipe information includes information required for executing the recipe, and after the recipe is executed, information of the result of executing the recipe is added to the recipe information.

Further, in this embodiment, for the convenience of description, information about a recipe that is managed through the management computer 30 is referred to as management recipe information in the following description. The management recipe information, for example, may include the same information as recipe information and may additionally include information for managing such information.

As a detailed example, the recipe information and the recipe management information each may include the information of all of the lower-order recipes included in an integrated recipe or may include the information of some of the lower-order recipes included in an integrated recipe.

Further, the recipe information and the recipe management information, for example, each may include correspondence of information that is a key (information of input) and information relating to the key (information about output).

[Control Computer]

Figure 3:
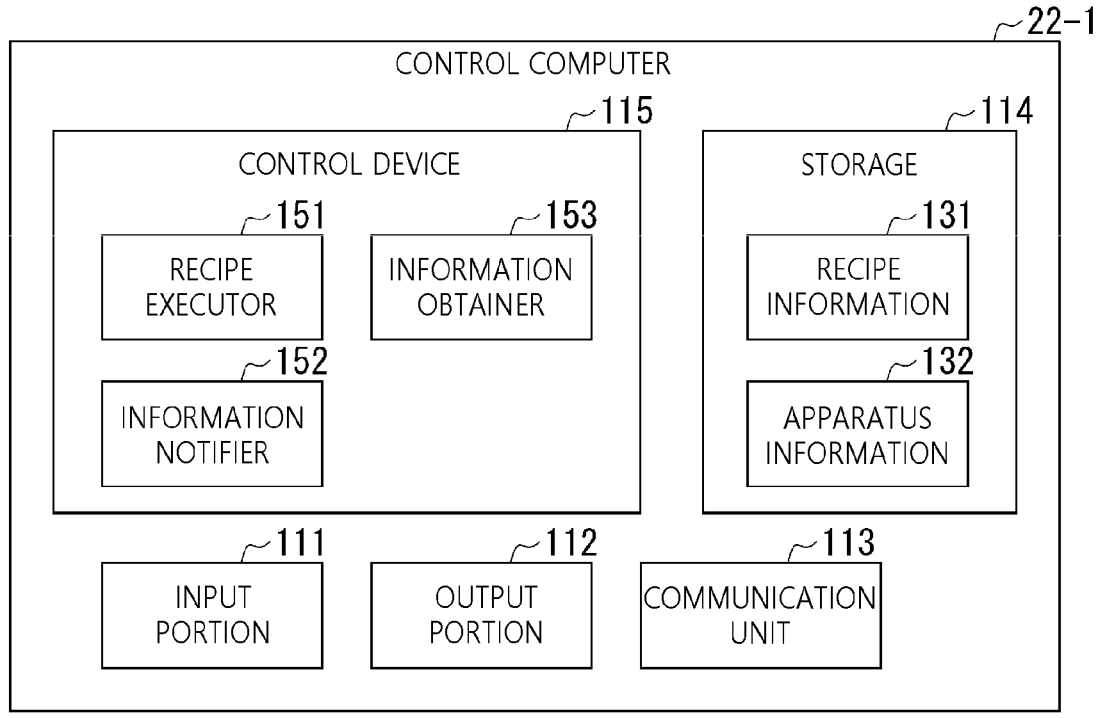
FIG. 3 is a view showing the configuration of function blocks of a control computer according to an embodiment (the first embodiment) of the present disclosure.

FIG. 3 is a view showing the configuration of function blocks of the control computer 22-1 according to an embodiment (the first embodiment) of the present disclosure.

Function blocks of the control computer 22-1 are described.

The control computer 22-1 includes an input portion 111, an output portion 112, a communication unit 113, a storage 114, and a control device 115.

The control device 115 includes a recipe executor 151, an information notifier 152, and an information obtainer 153.

The input portion 111 has a function of inputting information from the outside.

In this embodiment, the input portion 111 inputs information that is output from the input device 23.

Further, the input portion 111, for example, may have a function of inputting information from an external storage medium, etc.

The output portion 112 has a function of outputting information to the outside.

In this embodiment, the output portion 112 outputs information of a display object on the display device 21.

Further, the output portion 112, for example, may have a function of outputting information to an external storage medium, etc.

The communication unit 113 has a function of communicating with the outside.

In this embodiment, the communication unit 113 has a function of communicating with the management computer 30.

The storage 114 has a function of storing information.

In this embodiment, the storage 114 stores recipe information 131, apparatus information 132, etc.

In this case, the recipe information 131 includes information about a recipe of processing that is executed or a recipe of processing that has been executed in the charged particle beam apparatus 10-1 comprising the control computer 22-1 and includes information of the result of executing a recipe after the recipe is executed.

Further, the apparatus information 132 is information about the individual of the charged particle beam apparatus 10-1 comprising the control computer 22-1 and includes information of peculiar apparatus difference (machine difference) in the individual.

The control device 115 has a function of performing various types of processing and control.

In this embodiment, the control device 115 includes a processor such as a Central Processing Unit (CPU) and performs various types of processing and control by executing a predetermined control program. The control program, for example, may be stored in the storage 114.

The recipe executor 151 controls operation of the charged particle beam apparatus 10-1 based on a predetermined recipe. In this embodiment, the recipe is a recipe that is specified by the recipe information 131 stored in the storage 114.

The information notifier 152 transmits information of a notification object to the management computer 30 through the communication unit 113, thereby notifying the management computer 30 of the information.

The information obtainer 153 obtains predetermined information. The information is, for example, information input by the input portion 111, information received from the management computer 30 by the communication unit 113, or information stored in the storage 114.

[Management Computer]

Figure 4:
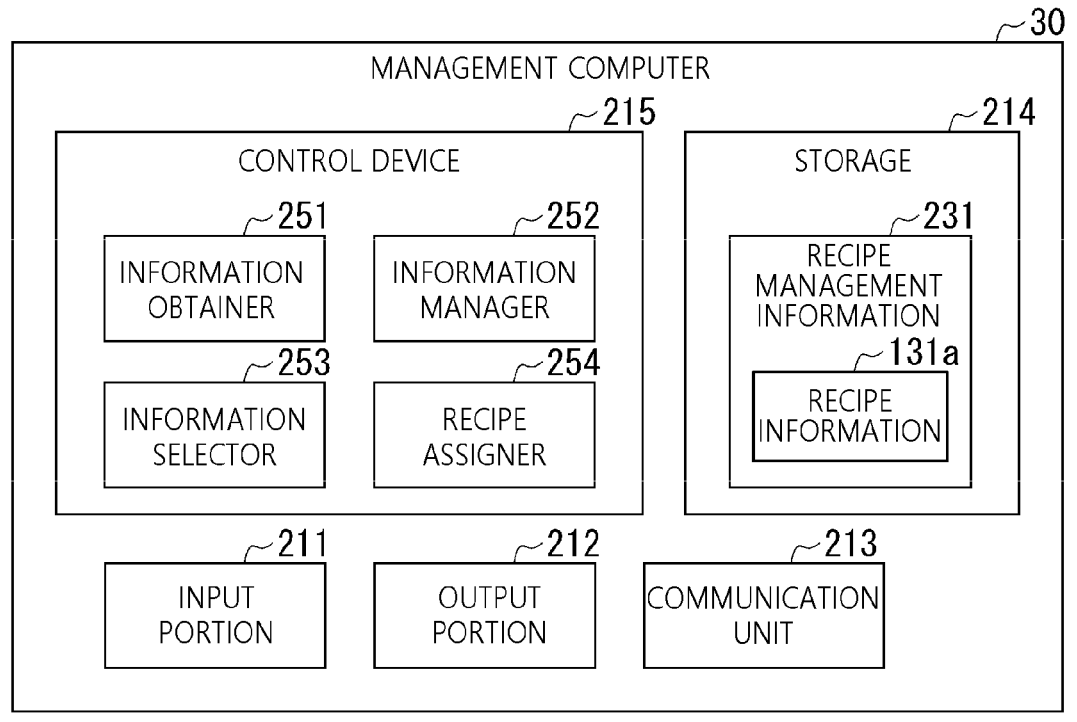
FIG. 4 is a view showing the configuration of function blocks of a management computer according to an embodiment (the first embodiment) of the present disclosure.

FIG. 4 is a view showing the configuration of function blocks of the management computer 30 according to an embodiment (the first embodiment) of the present disclosure.

Function blocks of the management computer 30 are described.

The management computer 30 includes an input portion 211, an output portion 212, a communication unit 213, a storage 214, and a control device 215.

The control device 215 includes an information obtainer 251, an information manager 252, an information selector 253, and a recipe assigner 254.

The input portion 211 has a function of inputting information from the outside.

In this embodiment, the input portion 211 includes an input device including a mouse and a keyboard and inputs information received when the input device is operated by an operator (in this embodiment, the operator 31).

Further, the input portion 211, for example, may have a function of inputting information from an external storage medium, etc.

The output portion 212 has a function of outputting information to the outside.

In this embodiment, the output portion 212 includes a display device and outputs information of a display object on the display device.

Further, the output portion 212, for example, may have a function of outputting information to an external storage medium, etc.

The communication unit 213 has a function of communicating with the outside.

In this embodiment, the communication unit 213 has a function of communicating with the control computers 22-1~22-N of the charged particle beam apparatuses 10-1~10-N.

The storage 214 has a function of storing information.

In this embodiment, the storage 214 stores recipe management information 231, etc.

In this case, the recipe management information 231 includes information about the recipe of processing that has been executed or the recipe of processing that is executed in each of the charged particle beam apparatuses 10-1~10-N, and includes information of the result of executing a recipe after the recipe is executed.

In this embodiment, the recipe management information 231 includes recipe information 131a that is the same information as the recipe information 131.

The control device 215 has a function of performing various types of processing and control.

In this embodiment, the control device 215 includes a processor such as a CPU and performs various types of processing and control by executing a predetermined control program. The control program, for example, may be stored in the storage 214.

The information obtainer 251 obtains predetermined information. The information is, for example, information input by the input portion 211, information received from the control computer 22-1~22-N of the charged particle beam apparatuses 10-1~10-N by the communication unit 213, or information stored in the storage 214.

The information manager 252 manages information about a recipe and, in this embodiment, manages the recipe management information 231.

The information selector 253 has a function of selecting information relating to information that is a key. In this embodiment, these items of information are information about a recipe and the information selector 253 selects information based on the recipe management information 231.

In this case, for example, when information that is a key and relevant information correspond to each other one to one, the information selector 253 may automatically select relevant information from the information that is a key.

Further, for example, when information that is a key and relevant information correspond to each other in a one-to-many relationship, the plurality of items of relevant information are displayed as candidates, whereby they are proposed to the operator 31. Further, information designated by operation by the operator 31 may be selected from the plurality of items of relevant information.

The recipe assigner 254 has a function of assigning a recipe to a sample (which may be referred to as a sample piece). Further, the recipe assigner 254 transmits information about assignment of a recipe, as information of a notification object, to the control computers 22-1~22-N of the charged particle beam apparatuses 10-1~10-N of the notification object through the communication unit 213, thereby notifying the control computers 22-1~22-N of the information.

Example of Managing Recipe in Charged Particle Beam Processing System

An example of managing a recipe in the charged particle beam processing system 1 is described.

First, each of the charged particle beam apparatuses 10-1~10-N executes processing according to a recipe manually set by the operator 31 (processes the recipe).

In detail, in each of the control computers 22-1~22-N of the charged particle beam apparatuses 10-1~10-N, the information obtainer 153 obtains information input by the operator 31 and generates a recipe collectively including an observation condition, a processing condition, etc. based on the obtained information. Further, the recipe executor 151 executes processing of the recipe.

Further, the control computers 22-1~22-N include and store information t specifies the recipe in the recipe information 131.

Further, the information notifier 152 performs notification by transmitting the recipe information 131 to the management computer 30.

This notification, for example, may be performed every time processing of a recipe is executed or may be performed at every predetermined period.

In the management computer 30, the information obtainer 251 obtains recipe information 131 received from the control computers 22-1~22-N of the charged particle beam apparatuses 10-1~10-N and the information manager 252 stores and manages recipe management information 231 based on the recipe information 131.

In this configuration, the information manager 252, for example, may manage a plurality of items of recipe information 131 received from the control computers 22-1~22-N of a plurality of different charged particle beam apparatuses 10-1~10-N and may manage a plurality of items of recipe information 131 received a plurality of times from the control computers 22-1~22-N of the charged particle beam apparatuses 10-1~10-N.

The information manager 252 may perform processing of reading or editing for the recipe management information 231.

For example, the information manager 252 makes a display device display information included in the recipe management information 231 based on operation that is performed by the operator 31, thereby performing processing of enabling the information to be read by the operator 31.

Further, the information manager 252 performs processing of editing the recipe management information 231 based on operation that is performed by the operator 31.

In this embodiment, in the management computer 30, the information manager 252 manages various items of information, such as defect information, a processing size, a processing condition, and an observation condition, as a library. In this embodiment, these items of information may be included in the recipe management information 231.

In this case, in the management compute 30, when editing a recipe, in the case in which information (e.g., defect information, etc.) of an item registered in the library is designated as input, the information selector 253 selects information (e.g., information such as a processing size or a processing condition) of another item related to the above item.

In this embodiment, the information selector 253, for example, may automatically select information based on predetermined rules. Further, for example, when there are a plurality of items of information that are candidates to be selected, the information selector 253 may propose the plurality of items of information to the operator 31 by displaying them and may select information designated by operation by the operator 31.

In the management computer 30, the recipe assigner 254 assigns a recipe to individual targets to be processed. The recipe assigner 254, for example, may assign a recipe using information selected by the information selector 253. Further, the recipe assigner 254, for example, may assign a recipe with reference to the recipe management information 231.

In this embodiment, as the individual targets to be processed, individual holders are used. Information for identifying the holders (peculiar holder information) are set in each of the individual holders. In the management computer 30 and the charged particle beam apparatuses 10-1~10-N, it is possible to identify the holders based on the peculiar holder information.

In this case, the case in which a recipe is assigned to each holder that holds a sample was described in this embodiment, but the object to be assigned with a recipe may be anything.

For example, as a fixing part such as the holder for fixing a sample, another component that can convey a sample may be used instead of the holder. As an example, when a sample having a wafer shape is handled, the wafer may be conveyed by a cassette.

The recipe assigner 254 transmits and notifies of information of a recipe to a control computer of a charged particle beam apparatus (one or more of the control computers 22-1~22-N of the charged particle beam apparatuses 10-1~10-N) in which a holder assigned with the recipe is performed. This notification, for example, may be performed in advance before the holder is processed or may be performed in accordance with a request from the control computers 22-1~22-N when the holder is processed.

In the control computers 22-1~22-N of the charged particle beam apparatuses 10-1~10-N, the information obtainer 153 obtains information of a recipe notified of from the management computer and includes and stores the information in the recipe information 131.

In each of the charged particle beam apparatuses 10-1~10-N, when a holder assigned with a recipe is loaded (conveyed), the recipe executor 151 performs setting of the conditions (e.g., an observation condition and a processing condition) designated in the recipe and performs adjustment for satisfying the conditions, if necessary, thereby executing processing of the recipe.

Herein, in this embodiment, in each of the charged particle beam apparatuses 10-1~10-N, processing of a recipe assigned by the management computer 30 is automatically performed by the recipe executor 151.

Further, preparing and conveying (taking in and taking out) a holder is manually performed by the operator in this embodiment, but, as another configuration example, some or all of these processes may be automatically performed by the charged particle beam apparatuses 10-1~10-N.

In each of the charged particle beam apparatuses 10-1~10-N, the information notifier 152 may notify the management computer 30 of information such as the execution result and progress of a recipe by transmitting the information.

In this case, the recipe may have an information group (first parameter) that does not depend on the charged particle beam apparatuses 10-1~10-N and an information group (second parameter) that depends on the apparatuses.

In this case, the control computers 22-1~22-N of the charged particle beam apparatuses 10-1~10-N, when executing processing of a recipe, use information obtained from the management computer 30 intactly for the first parameter and use the information, for the second parameter, after substituting information, which each of the apparatuses has, for the information or changing the information into optimal information for each of the apparatuses. Such substituting or changing of information about the second parameter may be performed based on apparatus information 132.

Further, the first parameter, for example, may be information about a sample.

Further, the second parameter, for example, may be information for compensating for individual differences (e.g., a manufacturing error, a calibration error, or the like) that may exist even in the of apparatuses of an identical model, or, as another example, may be information for compensating for a difference in model that may exist in different models of apparatuses.

Detailed Examples of Manual Input Item and Automatic Input Item in Management Computer (30)

Detailed examples of a manual input item and an automatic input item (Input-Output) in the management computer 30 are described.

Detailed Example 1

In the management computer 30, information (in this example, defect information) of manual input items (Input) and information (in this example, information of a recipe, etc.) of an automatic input item (Output) are matched to each other based on recipe information 131 obtained from the charged particle beam apparatuses 10-1~10-N.

Further, when a recipe is assigned, defect information (e.g., a kind, a size, a position, etc.) is input in the management computer 30 as a manual input item by the operator 31.

Accordingly, in the management computer 30, one or more of a recipe for automatic MS corresponding to the manual input item, a processing recipe corresponding to the manual input item, and a processing position information corresponding to the manual input item are automatically set (set and input) as information of an automatic input item corresponding to information of the manual input item that has been input. This setting, for example, may be performed by the information selector 253. Further, the recipe assigner 254 assigns a recipe including a condition specified by the information of the automatic input item corresponding to the information of the manual input item that has been input.

Detailed Example 2

In the management computer 30, information (in this example, chip information or wafer information) of manual input items (Input) and information (in this example, information of a recipe, etc.) of an automatic input item (Output) are matched to each other based on recipe information 131 obtained from the charged particle beam apparatuses 10-1~10-N.

Further, when a recipe is assigned, chip information or wafer information is input in the management computer 30 as a manual input item by the operator 31.

Accordingly, a recipe for alignment corresponding to the automatic input item is automatically set (set and input) in the management computer 30 as information of the automatic input item corresponding to the information of the input manual input item. This setting, for example, may be performed by the information selector 253. Further, the recipe assigner 254 assigns a recipe including a condition specified by the information of the automatic input item corresponding to the information of the input manual input item that has been input.

In this case, it was described in this embodiment that a manual input item is input in the management computer 30 directly from the operator 31, but, as another configuration example, the management computer 30 may be configured, in another apparatus (e.g., the charged particle beam apparatuses 10-1~10-N), to receive information of an input manual input item from the another apparatus.

Example of Processing Order in Charged Particle Beam Apparatus

Figure 5:
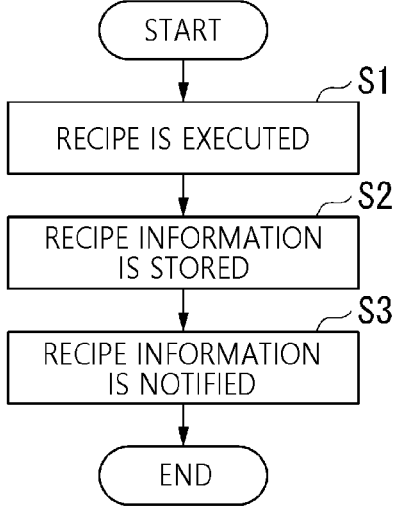
FIG. 5 is a view showing an example of the order of processing that is performed in the charged particle beam apparatus according to an embodiment (the first embodiment) of the present disclosure.

FIG. 5 is a view showing an example of the order of processing that is performed in the charged particle beam apparatuses 10-1~10-N according to an embodiment (the first embodiment) of the present disclosure.

Further, in this embodiment, the orders of processing that are performed in the charged particle beam apparatuses 10-1~10-N are the same, so the charged particle beam apparatus 10-1 is described as a representative.

Further, in this example, the case in which a recipe is set for individual holders is described.

In the processing order shown in FIG. 5, the management computer 30 is notified of information of a recipe set by the operator 31 from the charged particle beam apparatus 10-1. (Step S1)

The charged particle beam apparatus 10-1 executes processing of the recipe set by the operator 31 for a predetermined holder.

Further, the charged particle beam apparatus 10-1 moves on to processing of step S2.
(Step S2)

The charged particle beam apparatus 10-1 stores the information of the executed recipe in the storage 114 as recipe information 131.

Further, the charged particle beam apparatus 10-1 moves on to processing of step S3.
(Step S3)

The charged particle beam apparatus 10-1 notifies the management computer 30 of the recipe information 131 for information of one or a plurality of executed recipes.

Further, the charged particle beam apparatus 10-1 finishes the processing of this flow.

As a detailed example, as for the charged particle beam apparatus 10-1, the operator 31 sets an observation condition and a processing condition for manufacturing a sample (e.g., a TEM sample), and when determining that it is possible to manufacture a sample without a problem by executing processing of a recipe having the set conditions, the operator 31 performs operation for notifying the management computer 30 of information of the recipe arranging the conditions from the charged particle beam apparatus 10-1. In this case, in the charged particle beam apparatus 10-1, the processing of step S2 and the processing of step S3 may be performed, for example, when the operator 31 performs predetermined operation after the operator 31 determines that it is possible to manufacture a sample without a problem through the processing of step S1.

In this case, the case in which the management computer 30 is notified of the recipe information 131 from each of the charged particle beam apparatuses 10-1~10-N was described in this embodiment, but, as another example, information of a recipe executed in each of the charged particle beam apparatuses 10-1~10-N may be input to the management computer 30 by operation of the operator 31.

Example of Processing Order in Management Computer

Figure 6:
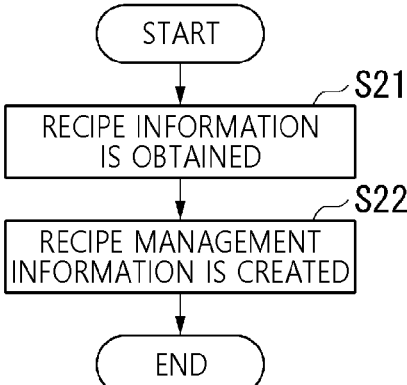
FIG. 6 is a view showing an example of the order of processing that is performed in the management computer according to an embodiment (the first embodiment) of the present disclosure.

FIG. 6 is a view showing an example of the order of processing that is performed in the management computer 30 according to an embodiment (the first embodiment) of the present disclosure.

In the processing order shown in FIG. 6, the management computer 30 generates recipe management information 231 (generates new information or generates post-update information by updating existing information) based on information received from the charged particle beam apparatuses 10-1~10-N.
(Step S21)

The management computer 30 receives recipe information 131 transmitted to the management computer 30 from each of the charged particle beam apparatuses 10-1~10-N, thereby obtaining the recipe information 131.

Further, the management computer 30 moves on to processing of step S22.
(Step S22)

The management computer 30 generates recipe management information 231 (generates new information or generates post-update information by updating existing information) based on the obtained information and stores the generated recipe management information 231 in the storage 214.

Further, the management computer 30 finishes the processing of this flow.

In this case, the recipe management information 231, for example, may include a portion or the whole of recipe information 131 itself notified of to the management computer 30 from the charged particle beam apparatuses 10-1~10-N or may include another information generated based on a portion or the whole of the recipe information 131 notified of to the management computer 30 from the charged particle beam apparatuses 10-1~10-N.

In this embodiment, the recipe management information 231 includes recipe information 131a.

Figure 7:
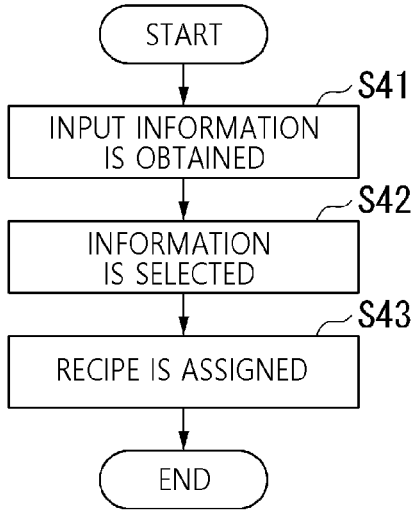
FIG. 7 is a view showing an example of the order of processing that is performed in the management computer according to an embodiment (the first embodiment) of the present disclosure.

FIG. 7 is a view showing an example of the order of processing that is performed in the management computer 30 according to an embodiment (the first embodiment) of the present disclosure.

In this example, the case in which a recipe is set for individual holders is described.

In the processing order shown in FIG. 7, the management computer 30 assigns a recipe to a holder that is used for processing in the charged particle beam apparatuses 10-1~10-N.
(Step S41)

The management computer 30, for the holder to be assigned with a recipe, obtains information (e.g., defect information, chip information, or the like) of a manual input item input by the operator 31.

Further, the management computer 30 moves on to processing of step S42.
(Step S42)

The management computer 30 considers the obtained information as a key and selects relevant information corresponding to the key (e.g., information of a recipe, etc. corresponding to the key) based on recipe management information 231. In this case, when one item of information is specified, the information is selected, or when there are candidates of a plurality of information, the candidates are proposed to the operator 31 and one item of information is selected based on designation from the operator 31.

Further, the management computer 30 moves on to processing of step S43.
(Step S43)

The management computer 30 assigns a recipe to the target holder based on the result of selecting the information.

Further, the management computer 30 includes and stores, for example, information about the recipe in the recipe management information 231.

Further, the management computer 30 notifies a predetermined charged particle beam apparatus (one or more of the charged particle beam apparatuses 10-1~10-N) of the information about the recipe. The predetermined charged particle beam apparatus, for example, may be all of the charged particle beam apparatuses 10-1~10-N or may be some of the charged particle beam apparatuses 10-1~10-N. The some of the apparatuses, for example, may be charged particle beam apparatuses that perform processing of a holder assigned with a recipe among the charged particle beam apparatuses 10-1~10-N.

Further, the management computer 30 finishes the processing of this flow.

In this case, notifying the charged particle beam apparatuses 10-1~10-N of information about a recipe from the management computer 30, for example, may be performed independently to the charged particle beam apparatuses 10-1~10-N or may be performed simultaneously to two or more of the charged particle beam apparatuses 10-1~10-N.

For example, when a recipe is executed independently in the charged particle beam apparatuses 10-1~10-N, notifying the charged particle beam apparatuses 10-1~10-N of information about the recipe from the management computer 30 is independently performed.

Meanwhile, two or more of the charged particle beam apparatuses 10-1~10-N may perform flow operation in coordination with each other in some cases. In this case, notifying the two or more charged particle beam apparatuses of information about a recipe from the management computer 30 may be performed simultaneously with progress of the flow operation. As a detailed example, it may be possible to consider operation in which a first charged particle beam apparatus in the flow operation executes processing and then the management computer 30 is notified of information about the processing, and the management computer 30 determines information to be notified of to a second charged particle beam apparatus based on the first information and notifies the second charged particle beam apparatus of the determined information.

Further, the information that is notified of to the charged particle beam apparatuses 10-1~10-N from the management computer 30 may not be necessarily information that specifies the whole of a recipe or may be information that specifies a portion of a recipe.

When information notified of from the management computer 30 is information that specifies a portion of a recipe, the control computers 22-1~22-N of the charged particle beam apparatuses 10-1~10-N generate information that specifies the whole of the recipe using the information and execute processing of the recipe based on the generated information. In this case, the control computers 22-1~22-N may determine information that specifies another portion of the recipe, for example, based on information that is input by operation by the operator 31, or may determine based on information included in recipe information 131 stored in the storage 114.

Further, when executing processing of a recipe based on information notified of from the management computer 31, the control computers 22-1~22-N of the charged particle beam apparatuses 10-1~10-N may substitute a recipe suitable for their own apparatuses for the above recipe based on apparatus information 132 stored in the storage 114 and then execute processing of the substituting recipe. Accordingly, when processing of a recipe is executed, the apparatus difference (machine difference) of each of the charged particle beam apparatuses 10-1~10-N can be compensated.

[Automatic Execution of Processing of Recipe in Charged Particle Beam Apparatus]

Further, in this embodiment, the orders of processing that are performed in the charged particle beam apparatuses 10-1~10-N are the same, so the charged particle beam apparatus 10-1 is described as a representative.

Further, in this example, the case in which a recipe is set for individual holders is described.

The order of automatically executing processing of a recipe based on information notified of from the management computer in the charged particle beam apparatus 10-1 is described.

In this embodiment, the charged particle beam apparatus 10-1 has a function of identifying the column of an SEM for observing a sample, the column of an FIB for processing a sample, and individual holders, communicating with the management computer 30, transmitting information about a recipe to the management computer 30, and executing observation and processing in accordance with designation in a recipe.

First, in the charged particle beam apparatus 10-1, the operator 31 selects an appropriate holder assigned with a recipe and obtains peculiar holder information of the holder.

Next, the operator 31 checks a method of mounting a sample on the selected holder. In this embodiment, when a recipe is assigned to a holder, the control computer 22-1 of the charged particle beam apparatus 10-1 displays a method of mounting a sample on the holder on the screen of the display device 21. In this case, the control computer 22-1, for example, in accordance with operation by the operator 31, may identify the selected holder based on the peculiar holder information and display a method of mounting a sample on the identified holder.

Next, the operator 31 mounts a sample on the holder in accordance with the displayed content and makes the sample be conveyed.

Then, the control computer 22-1 of the charged particle beam apparatus 10-1 makes manufacturing of a sample (e.g., a thin sample for TEM observation) started in accordance with the recipe assigned to the holder.

Further, after processing of the recipe that is supposed to be executed is completely finished, the operator 31 takes out the manufactured sample.

Further, a recipe that prescribes manufacturing of a sample (e.g., a thin sample for TEM observation) was exemplified in this case, but the present disclosure is not limited thereto and a recipe of certain processing may be used. For example, the operator 31 may use a recipe including a certain processing condition.

<Coordination of Charged Particle Beam Apparatuses of an Identical Model>

This section handles the case in which a plurality of charged particle beam apparatuses 10-1~10-N connected with the management computer 30 is the identical model and executes the same processing.

In this case, the management computer 30 executes processing of the same recipe through two or more charged particle beam apparatuses 10-1~10-N, thereby being able to perform processing of the same recipe in a parallel manner through the two or more charged particle beam apparatuses 10-1~10-N.

For example, the recipe assigner 254 can assign the same recipe that is processed in a parallel manner through a plurality of the charged particle beam apparatuses 10-1~10-N of an identical model.

Further, for example, the information manager 22 can manage information about the same recipe that is processed in a parallel manner with a plurality of the charged particle beam apparatuses 10-1~10-N of the identical model, for the charged particle beam apparatuses 10-1~10-N of the identical model.

In this case, the management computer 30 can use a portion or the whole of information about a recipe, for example, executed in one charged particle beam apparatus 10-1~10-N (e.g., information obtained by the information obtainer 251, etc.) as information about a recipe that is executed in another charged particle beam apparatus 10-1~10-N.

As for First Embodiment

AS described above, in the charged particle beam processing system 1 according to this embodiment, the management computer 30 can construct a recipe that is used in the charged particle beam apparatuses 10-1~10-N.

Further, the management computer 30 can manage the recipe and notify the charged particle beam apparatuses 10-1~10-N of the recipe.

For example, when there is a plurality of charged particle beam apparatuses 10-1~10-N under the management computer 30, the management computer 30 manages their recipes, whereby the plurality of charged particle beam apparatuses 10-1~10-N can share recipes.

In this way, in this embodiment, it is possible to reduce the work of adjusting and setting a condition for observation or processing by the operator 31 in an FIB-SEM composite apparatus (in this embodiment, the charged particle beam apparatuses 10-1~10-N).

For example, the charged particle beam processing system 1 according to this embodiment is configured such that the apparatus difference (machine difference) of the charged particle beam apparatuses 10-1~10-N is considered and then information for observation or processing is automatically set, whereby it is possible to remove the necessity of adjusting or setting conditions every time for the charged particle beam apparatuses 10-1~10-N by the operator 31.

Accordingly, the charged particle beam processing system 1 according to this embodiment can reduce a load of the operator 31 and it is also possible to reduce the difference in quality of samples due to proficiency of the operator 31, so it is possible to decrease reduction of a yield ratio.

In the charged particle beam processing system 1 according to this embodiment, it is possible to assign the same recipe for processing in a parallel manner through a plurality of the charged particle beam apparatuses 10-1~10-N of the identical model.

Accordingly, in the charged particle beam processing system 1 according to this embodiment, it is possible to achieve a coordination of a plurality of FIB-SEM composite apparatuses (horizontal coordination of the identical model).

Herein, the case in which a combination of a plurality of charged particle beam apparatuses 10-1~10-N connected with the management computer 30 is fixed was described in this embodiment, but, for example, hardware may be replaced or software may be replaced for one or more of the plurality of charged particle beam apparatuses 10-1~10-N. In this case, the recipe management information 231 may be changed (re-recorded) in the management computer 30, for example, to be suitable for the state of the plurality of charged particle beam apparatuses 10-1~10-N after replacement.

Second Embodiment

In this embodiment, differences from the first embodiment are described in detail and detailed description of the same configuration as the first embodiment is omitted.

In this embodiment, for the convenience of description, the components shown in FIG. 1 to FIG. 4 according to the first embodiment are described using the same reference numerals.

Processing in Charged Particle Beam Apparatus

In this embodiment, the orders of processing that are performed in the charged particle beam apparatuses 10-1~10-N are the same, so the charged particle beam apparatus 10-1 is described as a representative.

In the control computer 22-1 of the charged particle beam apparatus 10-1, in correspondence to information of an executed recipe, information of an execution result of the recipe is included and stored in recipe information 131. Further, when notifying the management computer 30 of the information of one or a plurality of executed recipes, the information notifier 152 notifies the management computer 30 of information of the execution result of processing of each of the recipes too.

In this case, the execution result of processing of a recipe, for example, includes information showing that the processing succeeded or failed and may include other information. The other information, for example, may be information showing the reason of a failure.

Example of Processing Order in Management Computer

Figure 8:
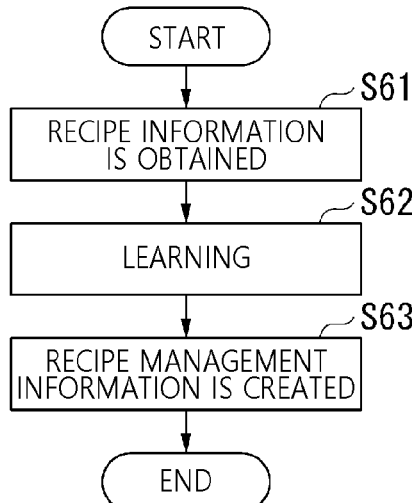
FIG. 8 is a view showing an example of the order of processing that is performed in a management computer according to an embodiment (second embodiment) of the present disclosure.

FIG. 8 is a view showing an example of the order of processing that is performed in the management computer 30 according to an embodiment (the second embodiment) of the present disclosure.

In the processing order shown in FIG. 8, the management computer 30 generates a recipe through machine learning based on information received from the charged particle beam apparatuses 10-1~10-N.

(Step S61)

The management computer 30 receives information of a recipe (recipe information 131) transmitted to the management computer 30 from each of the charged particle beam apparatuses 10-1~10-N, thereby obtaining the information. Further, the management computer 30 moves on to processing of step S62.

(Step S62)

The management computer 30 performs learning based on the obtained information.

In this case, as an algorithm of the learning, a certain algorithm may be used, and for example, an algorithm of which a weight when an execution result of processing of a recipe is successful becomes larger than a weight when an execution result of processing of a recipe is unsuccessful may be used. These weights, for example, may be 1 (success) to 0 (failure) or may have other ratios.

Further, the management computer 30 moves on to processing of step S63.

(Step S63)

The management computer 30 generates recipe management information 231 based on the result of the learning.

Further, the management computer 30 finishes the processing of this flow.

As for Second Embodiment

In the charged particle beam processing system 1 according to this embodiment, it is possible to learn a recipe suitable for defect information, chip information, or the like by using machine learning in the management computer 30.

Further, in this embodiment, similar to the first embodiment, it is possible to reduce the work of adjusting and setting a condition for observation or processing by the operator 31 in an FIB-SEM composite apparatus (in this embodiment, the charged particle beam apparatuses 10-1~10-N).

Third Embodiment

[Charged Particle Beam Processing System]

Figure 9:
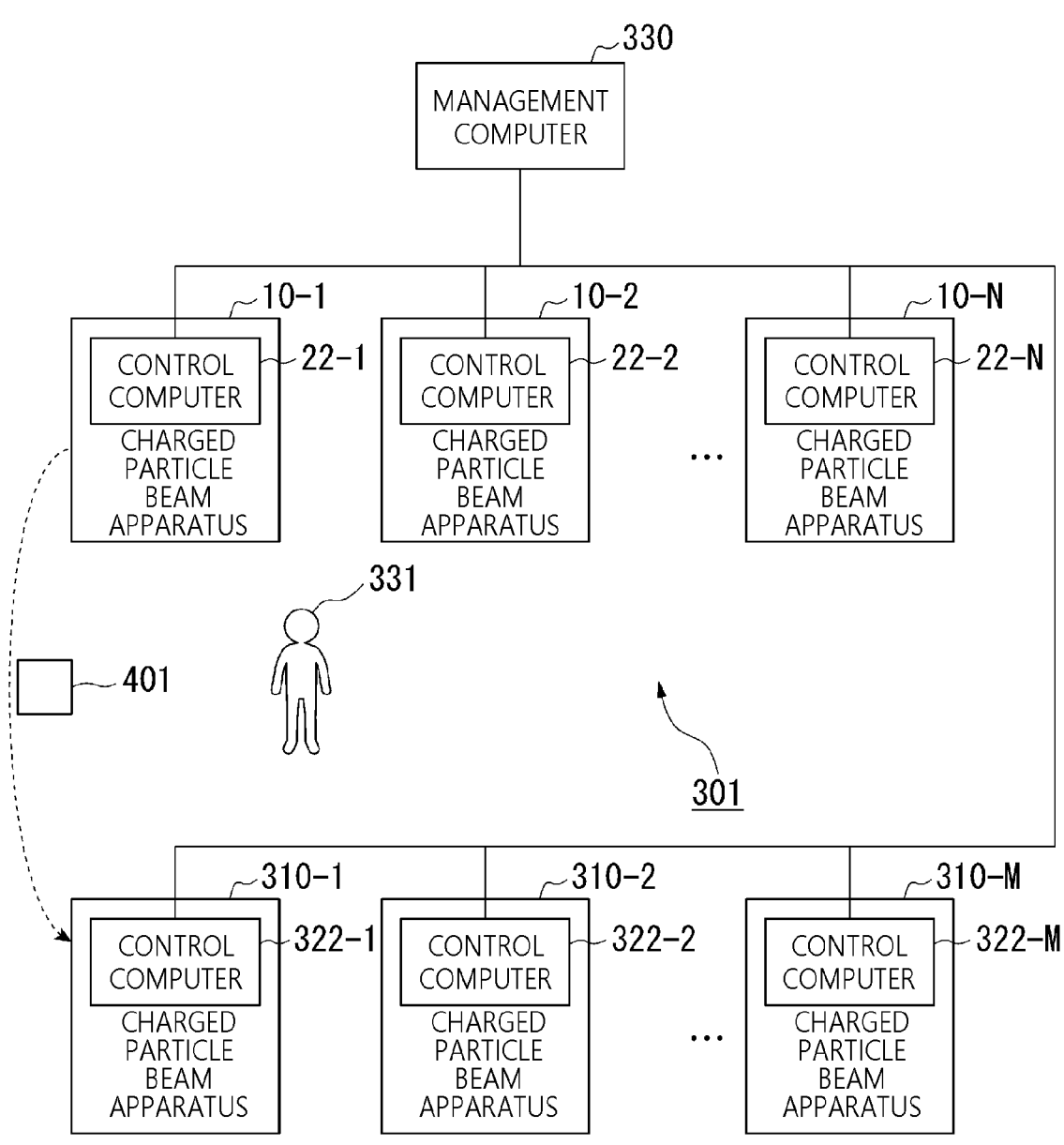
FIG. 9 is a view showing a schematic configuration of a charged particle beam processing system according to an embodiment (third embodiment) of the present disclosure.

FIG. 9 is a diagram showing a schematic configuration of a charged particle beam processing system 301 according to an embodiment (third embodiment) of the present disclosure.

The charged particle beam processing system 301 is briefly described.

In this embodiment, differences from the first embodiment or the second embodiment are described in detail and detailed description of the same configuration as the first embodiment or the second embodiment is omitted.

The charged particle beam processing system 301 includes N (N is an integer of 1 or more) charged particle beam apparatuses 10-1~10-N, M (M is an integer of 1 or more) charged particle beam apparatuses 310-1~310-M, and one management computer 330.

The charged particle beam apparatuses 10-1~10-N include control computers 22-1~22-N, respectively.

The charged particle beam apparatuses 310-1~310-M include control computers 322-1~322-M, respectively.

The management computer 330 and the control computers 22-1~22-N of the charged particle beam apparatuses 10-1~10-N are connected such that communication is possible. The management computer 330 includes a communication interface for communicating with the control computers 22-1~22-N of the charged particle beam apparatuses 10-1~10-N. The control computers 22-1~22-N of the charged particle beam apparatuses 10-1~10-N each include a communication interface for communicating with the management computer 30.

In this embodiment, communication is performed through wired lines, and as another configuration example, it may be performed through wireless lines.

The management computer 330 and the control computers 322-1~322-M of the charged particle beam apparatuses 310-1~310-M are connected such that communication is possible. The management computer 330 includes a communication interface for communicating with the control computers 322-1~322-M of the charged particle beam apparatuses 310-1~310-M. The control computers 322-1~322-M of the charged particle beam apparatuses 310-1~310-M each include a communication interface for communicating with the management computer 330.

In this embodiment, communication is performed through wired lines, and as another configuration example, it may be performed through wireless lines.

In this embodiment, the charged particle beam apparatuses 10-1~10-N and 310-1~310-M and the management computer 330 are operated by an operator 331.

In this case, in the example of FIG. 9, it is shown that the charged particle beam processing system 301 includes three or more charged particle beam apparatuses 10-1~10-N, but the number of the charged particle beam apparatuses 10-1~10-N included in the charged particle beam processing system 301 may be one or two.

Further, in the example of FIG. 9, it is shown that the charged particle beam processing system 301 includes three or more charged particle beam apparatuses 310-1~310-M, but the number of the charged particle beam apparatuses 310-1~310-M included in the charged particle beam processing system 301 may be one or two.

As described above, in this embodiment, for one or a plurality of charged particle beam apparatuses 10-1~10-N and one or a plurality of charged particle beam apparatuses 310-1~310-M, the management computer 330 network-connected with the charged particle beam apparatuses 10-1~10-N and 310-1~310-M is an upper computer.

Further, in this embodiment, the case in which the management computer 330 is composed of one computer is shown, but, as another configuration example, the management computer 330 may be configured by combining a plurality of computers.

Further, in the example of FIG. 9, for the convenience of description, the case in which the operator 331 operates the control computers 22-1~22-N and 322-1~322-M of all of the charged particle beam apparatuses 10-1~10-N and 310-1~310-M is shown, but the control computers 22-1~22-N and 322-1~322-M may be operated by the same operator 331 or may be operated by different operators.

Further, in the example of FIG. 9, for the convenience of description, the case in which the operator 331 controls the control computers 22-1~22-N and 322-1~322-M of the charged particle beam apparatuses 10-1~10-N and 310-1~310-M and the management computer 330 is shown, but, for example, another exclusive person (another operator) who controls the management computer 30 may be provided.

<Coordination of Different Models of Charged Particle Beam Apparatuses>

In this embodiment, the charged particle beam apparatuses 10-1~10-N connected with the management computer 330 are the same and the identical model as the charged particle beam apparatuses 10-1~10-N shown in FIG. 1 and execute the same processing.

Further, in this embodiment, the charged particle beam apparatuses 310-1~310-M connected with the management computer 330 are different models from the charged particle beam apparatuses 10-1~10-N, and the charged particle beam apparatuses 310-1~310-M execute the same processing.

The management computer 330 has the same function as the management computer 30 shown in FIG. 1 except for controlling a plurality of models of charged particle beam apparatuses 10-1~10-N and 310-1~310-M.

Further, the charged particle beam apparatuses 10-1~10-N and the charged particle beam apparatuses 310-1~310-M are different in configuration and operation in that they are different in model. Similarly, the control computers 22-1~22-N and the control computers 322-1~322-M are different in configuration and operation in that they are different in model.

The management computer 330 can execute processing of a first recipe for a predetermined sample through a certain charged particle beam apparatus 10-i (i is any one integer of 1~N) and then can execute processing of a second recipe for the post-processing sample through a certain charged particle beam apparatus 310-j (j is any one integer of 1~M). In this case, when processing of the first recipe for the sample is finished, the sample (sample that has undergone execution of processing of the first recipe) is moved from the charge particle beam apparatus 10-i that has performed processing of the first recipe to the charge particle beam apparatus 310-j that executes processing of the second recipe. The sample, for example, may be moved together with the holder holding the sample.

For example, the charged particle beam apparatus 10-1 is a first model and the charged particle beam apparatus 310-1 is a second model. In this case, the first model and the second model are different models.

As a detailed example, the first model is a model of a form of ⌈A001⌋, etc., and the second model may be a model of a form different from the first model such as ⌈A002⌋. Further, ⌈A001⌋ and ⌈A002⌋ are not necessarily actual numbers and are numbers for description in this case.

In this case, for example, it is possible to mount an automatic micro sampled-sample on a holder for a second model having a small stage in the charged particle beam apparatus 10-1 of the first model having a large stage on which a semiconductor wafer can be mounted, introduce a sample into the charged particle beam apparatus 310-1 of the second model, perform positioning based on information including the information of execution result of processing (execution result of processing of a recipe) in the first model, and execute high-definition finishing processing after manufacturing and processing a sample in the charged particle beam apparatus 10-1 of the first model in accordance with the recipe in the charged particle beam apparatus 310-1 of the second model. In this case, the management computer 330 notifies the charged particle beam apparatus 310-1 of the second model of information about a first recipe executed in the charged particle beam apparatus 10-1 of the first model (information including information of an execution result of processing of the first recipe). Accordingly, it is possible to perform processing (processing of a second recipe) using information about the first recipe (information including information of an execution result of processing of the first recipe) in the charged particle beam apparatus 310-1 of the second model.

Referring to FIG. 9, a detailed example is shown. First, the charged particle beam apparatus 10-1 of the first model executes processing of automatic MS. In this case, processing of mounting a manufactured micro sample onto a holder 401, which is used in the charged particle beam apparatus 310-1 of the second model, is performed in the charged particle beam apparatus 10-1 of the first model. Further, in the charged particle beam apparatus 10-1 of the first model, predetermined information about a micro sample (pillars) formed at the mounted on column-shaped portions holder 401 (e.g., coordinate information and image information) is obtained.

Next, in the charged particle beam apparatus 310-j of the second model, the holder 401 having the micro sample mounted by the charged particle beam apparatus 10-1 of the first model is loaded (conveyed) and then a position (position for performing post process in accordance with a recipe) is determined using predetermined information (e.g., coordinate information and image information) obtained in the charged particle beam apparatus 10-1 of the first model. Further, in the charged particle beam apparatus 310-1 of the second model, post process after processing in the first model is executed in accordance with a recipe. In this case, the post process, for example, may be post processing or observation.

As described above, it is possible to make a sample through the charged particle beam apparatus 10-1 of the first model and perform post process of the sample through the charged particle beam apparatus 310-1 of the second model.

In this configuration, the management computer 330 notifies the charged particle beam apparatus 310-1 of the second model of information about a recipe, for example, based on recipe management information (the same as the recipe management information 231 shown in FIG. 3) generated using the information obtained from the charged particle beam apparatus 10-1 of the first model. In this embodiment, the management computer 330 notifies the charged particle beam apparatus 310-1 of the second model of predetermined information about the micro sample (e.g., information including coordinate information and image information) obtained in the charged particle beam apparatus 10-1 of the first model. The information includes information of an execution result of processing in the charged particle beam apparatus 10-1 of the first model.

Further, when the information about a recipe in the charged particle beam apparatus 10-1 of the first model cannot be applied to the charged particle beam apparatus 310-1 of the second model, as is, the management computer 330 may convert the information into another information, which can be applied to the charged particle beam apparatus 310-1 of the second model, and then notify the charged particle beam apparatus 310-1 of the second model of the information after conversion.

In this case, the case of coordinating the charged particle beam apparatus 10-1 of the first model and the charged particle beam apparatus 310-1 of the second model is described, but, for example, the management computer 330 may execute processing of the same recipe in a parallel manner through a plurality of the charged particle beam apparatuses 10-1~10-N of the first model and execute processing of a recipe, which follows processing by each of the charged particle beam apparatuses 10-1~10-N, through each of a plurality of the charged particle beam apparatus 310-1~310-M of the second model.

For example, a recipe assigner (a unit having the same function as the recipe assigner 254 shown in FIG. 4) can use a portion or the whole of information about the recipe executed in one charged particle beam apparatus 10-i, that is, information obtained by an information obtainer (a unit having the same function as the information obtainer 251 shown in FIG. 4) as information about a recipe that is executed in another charged particle beam apparatus 310-j.

For example, the recipe assigner assigns a first recipe to a charged particle beam apparatus 10-i of the first model and assigns a second recipe subsequent to the first recipe to a charged particle beam apparatus 310-j of a second model that is different from the first model.

Further, an information manager (a unit having the same function as the information manager 252 shown in FIG. 4) manages information about the first recipe for the charged particle beam apparatus 10-I of the first model and manages information about the second recipe for the charged particle beam apparatus 310-j of the second model.

Further, as the number of the models of different models of charged particle beam apparatuses included in the plurality of charged particle beam apparatuses 10-1~10-N and 310-1~310-M that are connected with the management computer 330, not only two models of charged particle beam apparatuses may be included, but three or more models of charged particle beam apparatuses may be included. In this case, the management computer 330 may sequentially execute processing of recipes in coordination sequentially through three or more models of charged particle beam apparatuses.

As for Third Embodiment

In the charged particle beam processing system 301 according to this embodiment, even though a plurality of charged particle beam apparatuses 10-1~10-N and 310-1~310-M include two or more different models, it is possible to reduce the work of adjusting and setting a condition for observation or processing by the operator 331 through an FIB-SEM composite apparatus (in this embodiment, the charged particle beam apparatuses 10-1~10-N and 310-1~310-M).

In a charged particle beam processing system 301 according to this embodiment, it is possible to assign a first recipe to of the charged particle beam apparatuses 10-1~10-N of the first model and assign a second recipe subsequent to the first recipe to the charged particle beam apparatuses 310-1~310-M of the second model that is different from the first model.

In the charged particle beam processing system 301 according to this embodiment, it is possible to manages information about the first recipe for the charged particle beam apparatuses 10-1~10-N of the first model and manages information about the second recipe subsequent to the first recipe for the charged particle beam apparatuses 310-1~310-M of the second model that is different from the first model. In the charged particle beam processing system 301 according to this embodiment, it is possible to use a portion or the whole of information executed in one charged particle beam apparatus 10-1~10-N as information about a recipe that is executed in another charged particle beam apparatus 310-1~310-M.

In this way, in the charged particle beam processing system 301 according to this embodiment, it is possible to achieve a coordination of a plurality of FIB-SEM composite apparatuses (vertical coordination of the different models).

For example, in the charged particle beam processing system 301 according to this embodiment, it is possible to make and execute the flow of serial processing, such as manufacturing a micro sample through charged particle beam apparatuses 10-1~10-N of the first model and processing and observing the manufactured micro sample through the charged particle beam apparatuses 310-1~310-M, of the second model as a recipe.

As for Above Embodiments

Configuration Example

As a configuration example, it is a computer (in an embodiment, the management computer 30) that includes: an information obtainer (in an embodiment, the information obtainer 251) that obtains information about a recipe that is executed in a charged particle beam apparatus (in an embodiment, charged particle beam apparatuses 10-1~10-N) including a charge particle irradiation optics; and an information manager (in an embodiment, the information manager 252) that generates recipe management information (in an embodiment, the recipe management information 231) based on the information obtained by the information obtainer and stores the recipe management information in a storage (in an embodiment, the storage 214).

As a configuration example, the computer includes an information selector (in an embodiment, the information selector 253) that selects information based on recipe management information and a recipe assigner (in an embodiment, the recipe assigner 254) that assigns a recipe to predetermined targets (in an embodiment, a holder, etc.) based on the information selected by the information selector.

As a configuration example, in the computer, the information selector selects corresponding information (e.g., information of an automatic input item) from information that is a key (e.g., information of a manual input item) based on recipe management information.

As a configuration example, in the computer, the recipe assigner assigns a recipe to each holder of a sample as predetermined targets.

As a configuration example, in the computer, the information manager performs learning based on the information obtained by the information obtainer and generates recipe management information based on the result of the learning (e.g., the example of FIG. 8).

As a configuration example, in the computer, the information manager manages recipe management information about a recipe that is executed in a plurality of charged particle beam apparatuses.

As a configuration example, in the computer, the plurality of charged particle beam apparatuses includes different models.

As a configuration example, in the computer, a portion or the whole of information about a recipe executed in one charged particle beam apparatus is used as information about a recipe that is executed in another charged particle beam apparatus.

As a configuration example, in the computer, the recipe assigner assigns the same recipe that is processed in a parallel manner through a plurality of the charged particle beam apparatus of the identical model.

As a configuration example, in the computer, the recipe assigner assigns a first recipe to a charged particle beam apparatus of the first model and assigns a second recipe subsequent to the first recipe to a charged particle beam apparatus of a second model that is different from the first model.

As a configuration example, in the computer, the charged particle irradiation optics includes one or both of a focused ion beam irradiation optics (in an embodiment, the focused ion beam irradiation optics 14) and an electron beam irradiation optics (in an embodiment, the electron beam irradiation optics 15).

As a configuration example, it is a program (in an embodiment, a program that is executed in the management computer 30) for making a computer execute a first process of obtaining information about a recipe that is executed in a charged particle beam apparatus including a charged particle irradiation optics (in the example of FIG. 6, the process of step S21) and a second process that generates recipe management information based on the information obtained by the first process and stores the recipe management information in a storage (in the example of FIG. 6, the process of step S22).

As a configuration example, it is a charged particle beam processing system (in an embodiment, the charged particle beam processing system 1) including a charged particle beam apparatus, which includes a charged particle irradiation optics, and a computer, in which the computer includes an information obtainer that obtains information about a recipe that is executed in the charged particle beam apparatus, an information manager that generates recipe management information based on the information obtained by the information obtainer and stores the recipe management information in a storage, an information selector that selects information based on the recipe management information, and a recipe assigner that assigns a recipe to predetermined targets based on the information selected by the information selector; and the charged particle beam apparatus includes a recipe executor (in an embodiment, the recipe executor 151) that executes processing of a recipe assigned by the computer.

In this configuration, processing may be performed by recording (storing) a program for implementing certain functions of certain devices (e.g., the management computer 30 and the control computers 22-1~22-N) according to the embodiments described above in a computer-readable recording medium and making a computer system read out the program recorded in the recording medium.

Further, the ⌈computer system⌋ stated herein may include an Operating System (OS) or hardware such as peripheral devices. Further, the ⌈computer-readable recording medium⌋ means a storage device such as writable nonvolatile memories, such as a flexible disc, a magneto-optical disc, a Read Only Memory (ROM), a flash memory, portable devices such as a Digital Versatile Disc (DVD), and hard disk installed in a computer system.

Further, the computer-readable recording medium, for example, is a non-temporal recording medium.

Further, the ⌈computer-readable recording medium⌋ includes also a device that keeps a program for a predetermined time such as a nonvolatile memory (e.g., a Dynamic Random Access Memory (DRAM) in a computer system that is a server or a client when a program is transmitted through a network such as the internet or a communication line such as telephone line.

Further, the program may be transmitted to another computer system from a computer system keeping the program in a storage, etc. through a transmission medium or by a carrier of transmission media. In this case, the ⌈transmission medium⌋ that transmits the program is a medium having a function of transmitting information such as a network (communication network) such as the internet or a communication line (communication wire) such as a telephone line.

Further, the program may be a program for implementing some of the functions described above. The program may be a program that can implement the functions by combination with other programs recorded in advance in a computer system, that is, a difference file (difference program).

The functions of certain components in certain devices described above (e.g., the management computer 30 and the control computers 22-1~22-N) may be implemented by a processor. For example, each processing in this embodiment may be implemented by a processor operating based on information such as a program and a computer-readable recording medium storing information such as a program. In this case, as the processor, for example, the functions of components may be implemented by individual hardware or the functions of components may be implemented by integrated hardware. For example, the processor may include hardware and the hardware may include at least one of a circuit that processes digital signals and a circuit that processes analog signals. For example, the processor may be configured using one or both of one or a plurality of circuit device or one or a plurality of circuit elements mounted on a circuit board. As the circuit devices, an Integrated Circuit (IC), etc. may be used and, as the circuit elements, a resistor, a capacitor, or the like may be used.

In this case, the processor, for example, may be a CPU. However, the processor is not limited to a CPU and various processors such as a Graphics Processing Unit (GPU) or a Digital Signal Processor (DSP) may be used. Further, the processor, for example, may be a hardware circuit by an Application Specific Integrated Circuit (ASIC). Further, the processor, for example, may be configured by a plurality of CPUs or may be configured by a hardware circuit by a plurality of ASICs. Further, the processor, for example, may be configured by a combination of hardware circuits by a plurality of ASICs. Further, the processor, for example, may include one or more of an amplification circuit processing analog signals or a filter circuit.

Embodiments of the present disclosure were described above with reference to drawings, but the detailed configuration is not limited to the embodiments, and design changes, etc. not departing from the spirit of the present disclosure are also included.

DESCRIPTION OF REFERENCE NUMERALS 1, 301: charged particle beam processing system, 10-1~10-N, 310-1~310-M: charged particle beam apparatus, 11: sample chamber, 12: sample stage, 12a: holder fixing bed, 13: stage drive mechanism, 13a: mover, 13b: incliner, 13c: rotator, 14: focused ion beam irradiation optics, 14a: ion source, 14b: ion optics, 15: electron beam irradiation optics, 15a: electron source, 15b: electron optics, 16: detector, 17: gas supplier, 17a: nozzle, 18: needle, 19: needle drive mechanism, 20: absorbed current detector, 21: display device, 22-1~22-N, 322-1~322-M: control computer, 23: input device, 30, 330: management computer, 31, 331: operator, 111, 211: input portion, 112, 212: output portion, 113, 213: communication unit, 114, 214: storage, 115, 215: control device, 131, 131a: recipe information, 132: apparatus information, 151: recipe executor, 152: information notifier, 153, 251: information obtainer, 231: recipe management information, 252: information manager, 253: information selector, 254: recipe assigner, 401: holder, FIB: focused ion beam, EB: electron beam, G: gas, P: sample piece holder, Q: sample piece, R: secondary charged particle, S: sample

The invention claimed is:

1. A charged particle beam processing system comprising a computer; and a charged particle beam apparatus that comprises a charged particle irradiation optics, wherein the charged particle beam processing system comprises two or more charged particle beam apparatuses including a first charged particle beam apparatus of a first model and a second charged particle beam apparatus of a second model that is different from the first model;

wherein the computer comprises:

an information obtainer configured to obtain information about a recipe that is executed in the charged particle beam apparatus;

an information manager configured to generate recipe management information based on the information obtained by the information obtainer and store the recipe management information in a storage;

an information selector configured to select information based on the recipe management information; and a recipe assigner configured to assign a recipe to predetermined targets based on the information selected by the information selector, and wherein the charged particle beam apparatus comprises a recipe executor configured to execute processing of a recipe assigned by the computer, wherein the charged particle beam processing system performs workflow through coordination of the two or more charged particle beam apparatuses and, in the workflow, after the first charged particle beam apparatus executes processing of a first recipe to a sample, the second charged particle beam apparatus executes processing of a second recipe to the sample to which the processing of the first recipe has been executed;

wherein the first charged particle beam apparatus, after executing processing of the first recipe, notifies the computer of first information about the processing;

wherein the computer determines second information that is to be notified to the second charged particle beam apparatus based on the first information notified from the first charged beam apparatus and notifies the second charged beam apparatus of the second information that is determined;

wherein the first information includes predetermined information about the sample mounted on a pillar in processing of the first recipe of the first charged particle beam apparatus;

wherein the second information is information enabling determination of a position for executing processing of the second recipe that is subsequent to processing of the first recipe; and wherein the second charged particle beam apparatus determines the position based on the second information notified from the computer and executes processing or process of observation as processing of the second recipe.

2. The charged particle beam processing system according to claim 1, wherein the first charged particle beam apparatus notifies the computer of information regarding success or failure that shows, as a result of executing processing of the first recipe, whether the processing of the first recipe succeeded.

3. The charged particle beam processing system according to claim 1, wherein processing of the first recipe is processing of automatic micro-sampling of the sample; and processing of the second recipe is processing of finishing processing of the sample.

4. The charged particle beam processing system according to claim 1, wherein each of the charged particle beam apparatuses, when executing processing of the recipe based on information notified from the computer, after substituting a recipe that is suitable for own charged particle beam apparatus, executes processing of the recipe that is substituted.

5. The charged particle beam processing system according to claim 1, wherein the information manager executes learning based on the information obtained by the information obtainer and generates the recipe management information based on a result of the learning.

6. The charged particle beam processing system according to claim 1, wherein the recipe assigner assigns the recipe to each holder of a sample as the predetermined targets.

7. The charged particle beam processing system according to claim 1, wherein the recipe management information includes information of all of lower-order recipes or a portion of lower-order recipes included in an integrated recipe of higher-order that is a combination of a plurality of lower-order recipes and also includes correspondence of information that is a key, which is information of a manual input item associated with a recipe, and information relating to the key, which is information of an automatic input item associated with a recipe;

the information selector, in case information that is the key is input by an operator, selects the information relating to the key based on the recipe management information; and the recipe assigner, based on information selected by the information selector, assigns, to the predetermined target, a recipe that includes a condition specified by the information.

8. The charged particle beam processing system according to claim 7, wherein information that is the key is defect information; and information relating to the key is one or more of a recipe for automatic MS, a processing recipe, and processing position information.

9. The charged particle beam processing system according to claim 7, wherein the information that is the key is chip information or wafer information; and information relating to the key is a recipe for alignment.

10. The charged particle beam processing system according to claim 1, wherein the charged particle irradiation optics includes one or both of a focused ion beam irradiation optics and an electron beam irradiation optics.

11. A charged particle beam processing system comprising a computer and a charged particle beam apparatus that comprises a charged particle irradiation optics, wherein the charged particle beam processing system comprises two or more charged particle beam apparatuses including a first charged particle beam apparatus of a first model and a second charged particle beam apparatus of a second model that is different from the first model, wherein the computer includes:

an information obtainer configured to obtain information about a recipe that is executed in the charged particle beam apparatus;

an information manager configured to generate recipe management information based on information obtained by the information obtainer and store the recipe management information in a storage;

an information selector configured to select information based on the recipe management information; and a recipe assigner configured to assign a recipe to predetermined targets based on the information selected by the information selector, wherein the charged particle beam apparatus comprises a recipe executor configured to execute processing of a recipe assigned by the computer, wherein the charged particle beam processing system performs workflow through coordination of the two or more charged particle beam apparatuses and, in the workflow, after the first charged particle beam apparatus executes processing of a first recipe to a sample, the second charged particle beam apparatus executes processing of a second recipe to the sample to which the processing of the first recipe has been executed;

wherein the first charged particle beam apparatus, after executing processing of the first recipe, notifies the computer of first information about the processing;

wherein the computer determines second information that is to be notified to the second charged particle beam apparatus based on the first information notified from the first charged beam apparatus and notifies the second charged beam apparatus of the second information that is determined; and wherein in case the first information notified from the first charged particle beam apparatus cannot be applied to the second charged particle beam apparatus, as is, the computer, after converting the first information to different information that can be applied to the second charged particle beam apparatus, notifies the second charged particle beam apparatus of information after conversion.

12. The charged particle beam processing system according to claim 11, wherein the information manager executes learning based on the information obtained by the information obtainer and generates the recipe management information based on a result of the learning.

* * * * *